(12) United States Patent
Liu

(10) Patent No.: US 12,074,021 B2
(45) Date of Patent: Aug. 27, 2024

(54) SEMICONDUCTOR DEVICE AND METHOD OF FORMING THE SAME

(71) Applicant: Taiwan Semiconductor Manufacturing Company, Ltd., Hsinchu (TW)

(72) Inventor: Chi-Chang Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/832,675

(22) Filed: Jun. 5, 2022

(65) Prior Publication Data

US 2022/0301861 A1 Sep. 22, 2022

Related U.S. Application Data

(62) Division of application No. 16/892,292, filed on Jun. 4, 2020, now Pat. No. 11,462,397.

(60) Provisional application No. 62/880,667, filed on Jul. 31, 2019.

(51) Int. Cl.
*H01L 21/02* (2006.01)
*H01L 23/532* (2006.01)
*H01L 29/51* (2006.01)

(52) U.S. Cl.
CPC .. *H01L 21/02211* (2013.01); *H01L 21/02126* (2013.01); *H01L 23/53295* (2013.01); *H01L 29/517* (2013.01)

(58) Field of Classification Search
CPC ......... H01L 21/02211; H01L 21/02126; H01L 23/53295; H01L 29/517
See application file for complete search history.

(56) References Cited

U.S. PATENT DOCUMENTS

| 2011/0204519 A1* | 8/2011 | Chikaki ............ H01L 23/53238 |
| | | 257/E23.165 |
| 2016/0379881 A1 | 12/2016 | He et al. |
| 2017/0133219 A1 | 5/2017 | Tak et al. |
| 2018/0233355 A1* | 8/2018 | Vrtis ................. H01L 21/02203 |
| 2019/0103265 A1 | 4/2019 | Kao et al. |

OTHER PUBLICATIONS

"Office Action of Taiwan Counterpart Application", issued on Jan. 25, 2024, p. 1-p. 3.

* cited by examiner

*Primary Examiner* — Monica D Harrison
*Assistant Examiner* — Andre C Stevenson
(74) *Attorney, Agent, or Firm* — JCIPRNET

(57) ABSTRACT

A method of forming a semiconductor device includes the following operations. A substrate is provided with a device and an insulating layer disposed over the device. A silicon-containing heterocyclic compound precursor and a first oxygen-containing compound precursor are introduced to the substrate, so as to form a zeroth dielectric layer on the insulating layer. A zeroth metal layer is formed in the zeroth dielectric layer. A silicon-containing linear compound precursor and a second oxygen-containing compound precursor are introduced to the substrate to form a first dielectric layer on the zeroth dielectric layer. A first metal layer is formed in the first dielectric layer.

20 Claims, 10 Drawing Sheets

SEMICONDUCTOR DEVICE AND METHOD OF FORMING THE SAME

CROSS-REFERENCE TO RELATED APPLICATION

This application is a divisional application of and claims the priority benefit of U.S. patent application Ser. No. 16/892,292, filed on Jun. 4, 2020. The U.S. patent application Ser. No. 16/892,292 claims the priority benefit of U.S. provisional application Ser. No. 62/880,667, filed on Jul. 31, 2019. The entirety of the above-mentioned patent application is hereby incorporated by reference herein and made a part of this specification.

BACKGROUND

As the density of semiconductor devices increases and as the size of circuit elements becomes smaller, resistance-capacitance (RC) delay time increasingly affects integrated circuit performance. Low-k dielectric materials, therefore, are used to reduce the RC delay. Low-k dielectric materials are particularly useful as inter-layer dielectrics and inter-metal dielectrics. However, low-k dielectric materials present problems during processing, especially during the fabrication of the conductive material used to make interconnection. Although the existing low-k dielectric materials have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
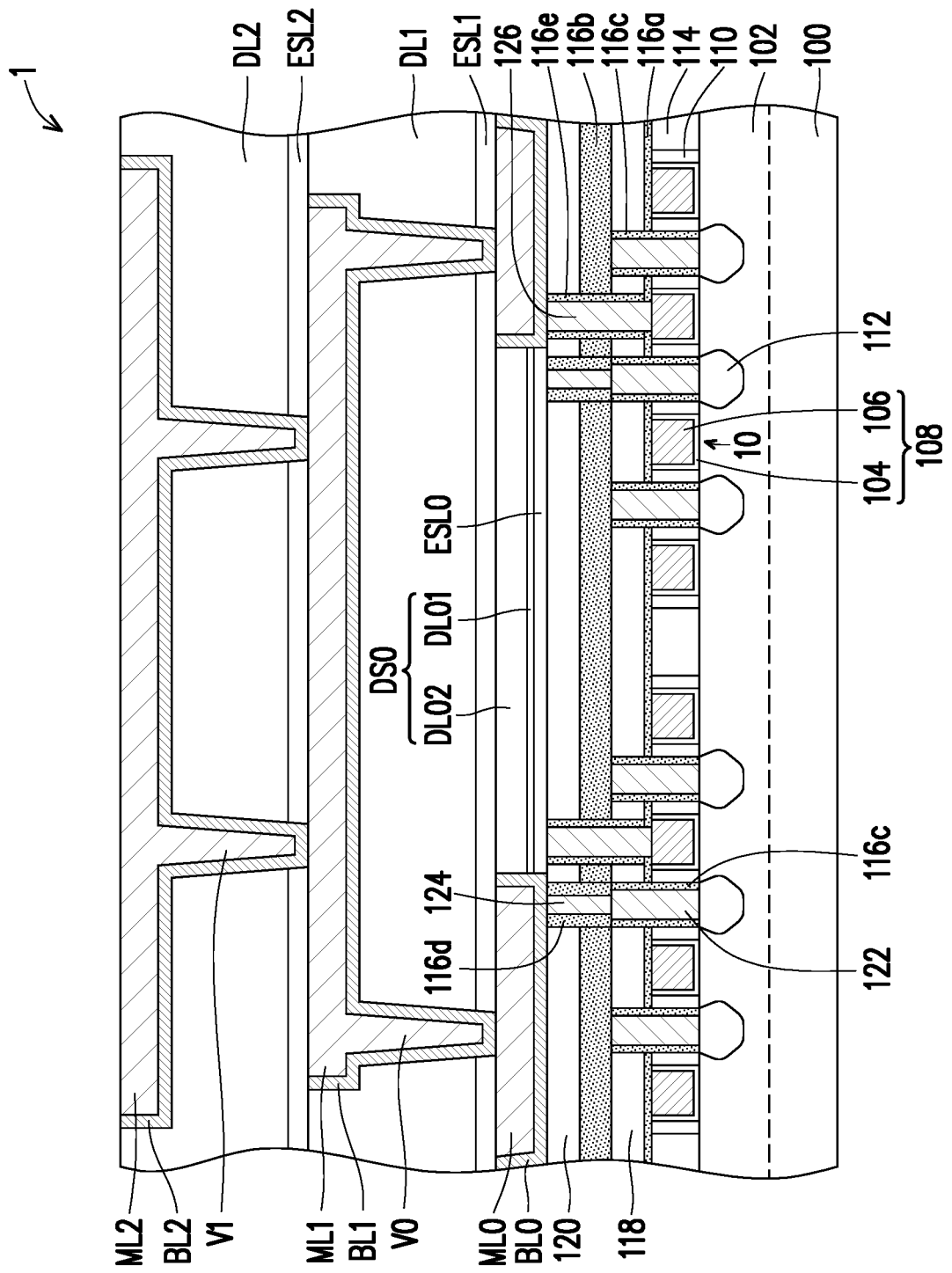
FIG. 1 is a schematic cross-sectional view of an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or act in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit in accordance with some embodiments.

Referring to FIG. 1, an integrated circuit 1 includes at least one device 10. The device 10 may be a portion of an integrated circuit chip or a system on chip (SoC) that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. The adjacent devices 10 may have the same or different functions.

In some embodiment, the device 10 includes a substrate 100 having at least one fin 102 and at least one gate stack 108. The substrate 100 and the fin 102 may be made by the same or different materials. The substrate 100 and fin 102 include an elementary semiconductor such as silicon or germanium, a compound semiconductor such as SiC or SiGe, the like, or a combination thereof. The gate stack 108 is across the fin 102. The gate stack 108 includes a gate dielectric layer 104 and a gate 106. In some embodiments, the gate dielectric layer 104 includes a high-k material such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In some embodiments, the gate 106 includes a work function metal layer and an overlying fill metal layer. The work function metal layer is a P-type work function metal layer or an N-type work function metal layer. The P-type work function metal layer includes TiN, WN, TaN, the like, or a combination thereof. The N-type work function metal layer includes TiAl, TiAlN, TaCN, the like, or a combination thereof. The fill metal layer includes copper (Cu), aluminum (Al), tungsten (W), the like, or a combination thereof. The adjacent gate stacks 108 may include the same or different work function metal layers.

In some embodiment, the device 10 further includes a spacer 110, a strained layer 112 and dielectric layers 114, 118 and 120. The spacer 110 is disposed on the sidewall of the gate stack 108. The strained layer 112 is disposed in the substrate 100 aside the gate stack 108. The spacer 110 includes a nitrogen-containing dielectric material, a carbon-containing dielectric material or both. The strained layer 112 includes a P-type strained layer or an N-type strained layer. The P-type strained layer includes silicon germanium (SiGe). The N-type strained layer includes silicon carbon (SiC), silicon phosphate (SiP), SiCP or a SiC/SiP multi-layer structure. Two adjacent gate stacks 108 may share one strained layer 112 therebetween. The strained layer 112 may be referred to as a "source/drain region". The dielectric layer 114 is formed aside the gate stack 108. The dielectric layer 114 is formed over the substrate 100 filling in gaps between the gate stacks 108. In some embodiments, the top surface of the dielectric layer 114 is substantially coplanar with the top surface of the gate stack 108. The dielectric layer 118 and the dielectric layer 120 are sequentially formed on the dielectric layer 114 and the gate stack 108. In some embodiments, each of the dielectric layers 114, 118 and 120 includes nitride such as silicon nitride, oxide such as silicon oxide, phosphosilicate glass (PSG), borosilicate glass (BSG), boron-doped phosphosilicate glass (BPSG), the like, or a combination thereof. Each of the dielectric layers 114, 118 and 120 may be referred to as an insulating layer in some examples.

In some embodiment, the device 10 further includes shielding patterns 116a to 116e, a metal stack 122, a source and drain contact 124 and a gate contact 126. The shielding pattern 116a is disposed over the gate stack 108 and between the dielectric layer 114 and the dielectric layer 118. The shielding pattern 116b is between the dielectric layer 118 and the dielectric layer 120. The metal stack 122 is through the dielectric layers 114 and 118 and is electrically connected to the strained layer 112. In some embodiments, the metal stack 122 is in physical contact with the strained layer 112 and the spacer 110. The shielding pattern 116c is between the metal stack 122 and the spacer 110 and between the metal stack 122 and the dielectric layer 118. In some embodiments, the shielding pattern 116c is in physical contact with the shielding pattern 116a. The source and drain contact 124 is electrically connected to the metal stack 122. The shielding pattern 116d is between the source and the drain contact 124 and the shielding pattern 116b and between the source and drain contact 124 and the dielectric layer 120. The gate contact 126 is electrically connected to the gate stack 108. In some embodiments, the gate contact 126 is through the dielectric layers 118 and 120 and in physical contact with the gate 106 of the gate stack 108. The shielding pattern 116e is between the gate contact 126 and the dielectric layer 118 and between the gate contact 126 and the dielectric layer 120. In some embodiments, the shielding pattern 116e is in physical contact with the shielding patterns 116a and 116b. In some embodiments, each of the metal stack 122, the source and drain contact 124 and the gate contact 126 includes tungsten (W), cobalt (Co), copper (Cu), titanium (Ti), the like, or a combination thereof. In some embodiments, each of the shielding patterns 116a to 116e includes SiN, SiC, SiCN, SiON, SiCON, the like, or a combination thereof.

In some embodiments, the integrated circuit 1 further includes an interconnect structure electrically connected to the at least one device 10. The interconnect structure includes a plurality of metal features embedded by a plurality of dielectric features. The metal features include metal layers ML0, ML1 and ML2 and metal vias V0 and V1. The dielectric features include dielectric layers DL01, DL02, DL1 and DL2. Specifically, a metal layer ML0 is embedded by the dielectric layers DL01 and DL02, at least one metal via V0 and an overlying metal layer ML1 are embedded by a dielectric layer DL1, and at least one metal via V1 and an overlying metal layer ML2 are embedded by a dielectric layer DL2.

In some embodiments, the metal layer ML0 is an ultra-high density (UHD) layer including a plurality of metal lines substantially parallel to each other. In some embodiments, the pitch of the metal lines of the metal layer ML0 is about 40 nm, 24 nm, 22 nm or less. In some embodiments, the metal layer ML0 is a low resistance metal material including tungsten (W), cobalt (Co), copper (Cu), aluminum (Al), the like, or a combination thereof. A barrier layer BL0 may be disposed between the metal layer ML0 and the dielectric structure DS0. The barrier layer BL0 may include Ti, Ta, TiN, TaN, the like, or a combination thereof. In some embodiments, the dielectric structure DS0 is referred to as a zeroth dielectric layer, and the metal layer ML0 is referred to as a zeroth metal layer.

The dielectric layer configured to surround the metal layer usually has a low-k property for reducing the RC delay. However, such low-k dielectric layer is usually soft and porous. When two adjacent metal lines of the metal layer are very long and disposed close to each other, the line openings and therefore the metal lines may be broken or bridged when they are defined in the low-k dielectric layer. For example, due to the chemicals used during the line opening defining step, contamination may occur. When there is an open pore in the dielectric material, processing fluids can enter the pores, thereby causing corrosion, mechanical damage, or an increase in the dielectric constant. Additionally, materials involved in the etching and ashing processes, such as fluorine and nitrogen, enter the porous dielectric layer and further damage the low-k dielectric material. Therefore, a low-k dielectric structure with enough hardness is required to solve these issues.

In some embodiments, the dielectric structure DS0 includes, from bottom to top, a dielectric layer DL01 and a dielectric layer DL02. In some embodiments, the dielectric structure DS0 includes a low-k material with sufficient hardness. Herein, the term "low-k" indicates a dielectric constant of less than about 3.2. In some embodiments, the dielectric structure DS0 is provided with a dielectric constant of less than about 3.2 and greater than 3.0, such as from about 3.10 to 3.19. Herein, the term "sufficient hardness" indicates a Young's modulus of greater than about 30 GPa. Such hardness is able to resist etching damage during the line opening defining step. In some embodiments, the dielectric structure DS0 is provided with a hardness of greater than about 30 GPa, such as from about 30 to 55 GPa.

In some embodiments, the average carbon atom content of the dielectric layer DL02 is higher than the average carbon atom content of the dielectric layer DL01. The dielectric layer DL02 is referred to as a carbon-rich dielectric layer in some examples.

In some embodiments, the average oxygen atom content of the dielectric layer DL02 is lower than the average oxygen atom content of the dielectric layer DL01. The dielectric layer DL01 is referred to as an oxygen-rich dielectric layer in some examples.

In some embodiments, the thickness ratio of the lower dielectric layer DL01 to the upper dielectric layer DL02 ranges from about 1:10 to 1:20. In some embodiments, the dielectric structure DS0 has a thickness of about 15 to 50 nm, the dielectric layer DL01 has a thickness of about 1 to 10 nm, and the dielectric layer DL02 has a thickness of about 14 to 40 nm. Specifically, the dielectric layer DL02 accounts for most of the dielectric structure DS0 in terms of thickness or amount, so the dielectric properties (e.g., dielectric constant and hardness) of the dielectric structure DS0 are dominated by the dielectric layer DL02.

In some embodiments, each of the dielectric layer DL01 and the dielectric layer DL02 includes a low-k material with sufficient hardness. In some embodiments, each of the dielectric layer DL01 and the dielectric layer DL02 has a dielectric constant of less than about 3.2 and greater than about 3.0, such as from about 3.10 to 3.19. In some embodiments, each of the dielectric layer DL01 and the dielectric layer DL02 has a Young's modulus of greater than about 30 GPa, such as from about 30 to 55 GPa. In some embodiments, each of the dielectric layer DL01 and the dielectric layer DL02 includes elements such as Si, O, C, and/or H. For example, each of the dielectric layer DL01 and the dielectric layer DL02 includes SiOCH, SiOC or a combination thereof. The compositions of each of the dielectric layer DL01 and the dielectric layer DL02 will be described in details below.

In some embodiments, an etching stop layer ESL0 is disposed between the dielectric layer DL01 and the dielectric layer 120. In some embodiments, the etching stop layer ESL0 includes a metal oxide containing a metal selected from the group consisting of metals of Group 4 of the periodic table, metals of Group 5 of the periodic table, metals of Group 6 of the periodic table, and yttrium. For example, the etching stop layer ESL0 includes SiCN, AlN, $Al_2O_3$, TaO, LaO or a combination thereof. The metal oxide forms an exceptionally thin layer that is resistant to ashing and/or chemical (e.g. hydrogen fluoride) exposure.

In some embodiments, the thickness ratio of the etching stop layer ESL0 to the dielectric layer DL02 ranges from about 1:5 to 1:40. In some embodiments, the etching stop layer ESL0 has a thickness of about 1 to 3 nm.

The metal layer ML1 may include a plurality of metal lines substantially parallel to each other. In some embodiments, the metal layer ML1 has a pattern density less than that of the metal layer ML0. In some embodiments, the metal layer ML1 and the underlying metal vias V0 are provided by a damascene process. The metal layer ML1 and the underlying metal vias V0 may include tungsten (W), cobalt (Co), copper (Cu), aluminum (Al), the like, or a combination thereof. In some embodiments, the method of forming metal layer ML1 and the underlying metal vias V0 includes performing a plating process, a sputtering process or a deposition process, and followed by a chemical mechanical polishing (CMP) process.

In some embodiments, a barrier layer BL1 may be disposed between the metal layer ML1 and the dielectric layer DL1. The barrier layer BL1 may include Ti, Ta, TiN, TaN, the like, or a combination thereof.

In some embodiments, the dielectric layer DL1 surrounds the metal layer ML1 and the underlying metal vias V0. In some embodiments, the dielectric layer DL1 has a dielectric constant less than that of the dielectric layer DL01 or DL02. In some embodiments, the dielectric layer DL1 includes a porous dielectric material having a dielectric constant of about 3.06 to 3.14. However, the disclosure is not limited thereto. In other embodiments, the dielectric layer DL1 has a dielectric constant comparable with that of the dielectric layer DL01 or DL02. In some embodiments, the dielectric layer DL1 is referred to as a first dielectric layer, and the metal layer ML1 is referred to as a first metal layer.

In some embodiments, an etching stop layer ESL1 is disposed between the dielectric layer DL1 and the dielectric layer DL02 and between the dielectric layer DL1 and the metal layer ML0. In some embodiments, the etching stop layer ESL1 includes a material different from that of the etching stop layer ESL0. In some embodiments, the etching stop layer ESL1 includes SiN, SiC, $Ti_xN_y$, $W_xC_y$, the like, or a combination thereof, wherein x and y are greater than zero.

In some embodiments, the thickness ratio of the etching stop layer ESL1 to the dielectric layer DL1 ranges from 1:6.7 to 1:50. In some embodiments, the etching stop layer ESL1 has a thickness of 1 to 3 nm, the dielectric layer DL1 has a thickness of 20 to 50 nm.

In some embodiments, the dielectric layer DL1 includes elements such as Si, O, C, and/or H. For example, the dielectric layer DL1 includes SiOCH, SiOC or a combination thereof. In some embodiments, the dielectric layer DL1 includes a material the same as that of the dielectric layer DL02 (or the dielectric structure DS0). Specifically, the dielectric layers DL1 and DL02 include the same elements, but the element contents between the dielectric layers DL1 and DL02 are different, so the dielectric constant and hardness of the dielectric layer DL1 are different from those of the dielectric layer DL02. In alternative embodiments, the dielectric layer DL1 may include a material different from that of the dielectric layer DL02 (or the dielectric structure DS0). For example, the dielectric layer DL1 includes silicon oxide, silicon nitride, silicon carbide, amorphous carbon, a photoresist material, a suitable hard mask material, or a combination thereof.

The metal layer ML2 may include a plurality of metal lines substantially parallel to each other. In some embodiments, the metal layer ML2 has a pattern density less than that of the metal layer ML0. In some embodiments, the metal layer ML2 and the underlying metal vias V1 are provided by a damascene process. In some embodiments, a barrier layer BL2 may be disposed between the metal layer ML2 and the dielectric layer DL2. The materials of the metal layer ML2, the metal vias V1 and the barrier layer BL2 are similar to those of the metal layer ML1, the metal vias V0 and the barrier layer BL1, so the details are not iterated herein.

In some embodiments, the dielectric layer DL2 surrounds the metal layer ML2 and the underlying metal vias V1. In some embodiments, the dielectric layer DL2 has a dielectric constant less than that of the dielectric structure DS0. In some embodiments, the dielectric layer DL2 includes a porous dielectric material having a dielectric constant of less than about 3.06 to 3.14. However, the disclosure is not limited thereto. In other embodiments, the dielectric layer DL2 has a dielectric constant comparable with that of the dielectric layer DL01 or DL02. In some embodiments, the dielectric layer DL2 is referred to as a second dielectric layer, and the metal layer ML2 is referred to as a second metal layer.

In some embodiments, the etching stop layer ESL2 is between the dielectric layer DL2 and the dielectric layer DL1 and between the dielectric layer DL2 and the metal layer ML1. The materials of the dielectric layer DL2 and the etching stop layer ESL2 are similar to those of the dielectric layer DL1 and the etching stop layer ESL1, so the details are not iterated herein.

In some embodiments, the thickness ratio of the etching stop layer ESL2 to the dielectric layer DL2 ranges from 1:6.7 to 1:50. In some embodiments, the etching stop layer ESL2 has a thickness of 1 to 3 nm, the dielectric layer DL2 has a thickness of 20 to 50 nm.

In some embodiments, the disclosure provides a semiconductor device including a gate 106, a strained layer 112, a source and drain contact 124, a metal line ML0 and a carbon-rich dielectric layer DL02. The gate 106 is disposed over a substrate 100. The strained layer 112 is disposed in the substrate 100 aside the gate 106. The source and drain contact 124 is disposed over and electrically connected to the strained layer 112. The metal line ML0 is disposed over and electrically connected to the source and drain contact 124. The carbon-rich dielectric layer DL02 is disposed over the source and drain contact 124 and around the metal line ML0, wherein the carbon-rich dielectric layer DL02 has a dielectric constant of 3.10 to 3.19.

As mentioned above, each of the metal layers ML1, ML2 and ML3 has a plurality of metal lines substantially parallel to each other. In some embodiments, when two adjacent metal lines of an ultra-high density (UHD) layer (e.g., metal layer ML1) extend very long and are disposed close to each other, a low-k dielectric structure (e.g., dielectric structure DS0) is configured to surround the UHD layer for reducing the RC delay while exhibiting sufficient hardness against the subsequent etching processes. Methods of forming such low-k dielectric structure and conductive structure are described below.

FIG. 2A to FIG. 2G are schematic cross-sectional views of a method of forming a conductive structure in accordance with some embodiments. In some embodiments, the method of forming the conductive structure may be implemented when fabricating, for example but not limited to, the metal layer ML0 of the integrated circuit 1 in FIG. 1, in which some elements are omitted for the sake of clarity and convenience. It is noted that, the cross-sectional views of FIG. 2A to FIG. 2F are not shown in FIG. 1 because they are taken along a direction perpendicular to the paper plane of FIG. 1.

Figure 3:
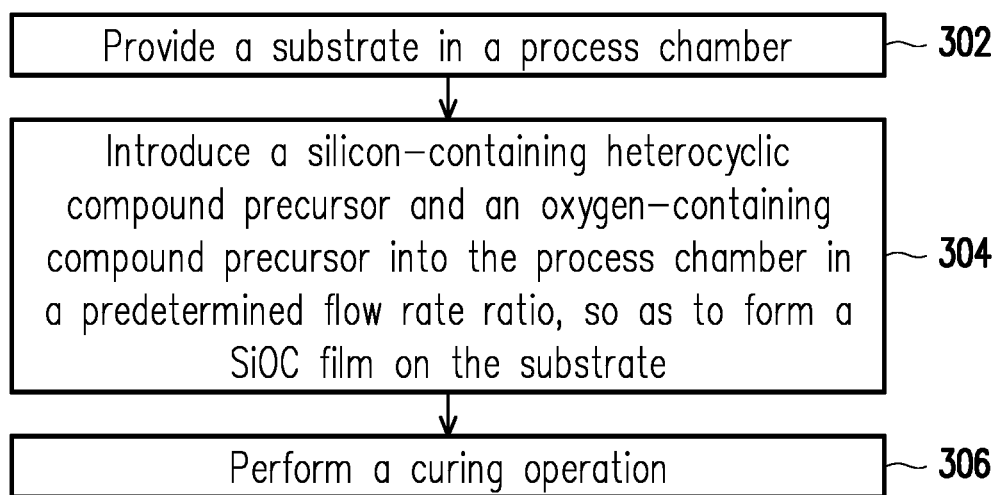
FIG. 3 is a flow chart of a method of forming a low-k dielectric structure in accordance with alternative embodiments.

FIG. 3 is a flow chart of a method of forming a low-k dielectric structure in accordance with alternative embodiments. In some embodiments, the method of forming the low-k dielectric structure may be implemented when fabricating, for example but not limited to, the dielectric structure DS0 of the integrated circuit 1 in FIG. 1.

Figure 2A:
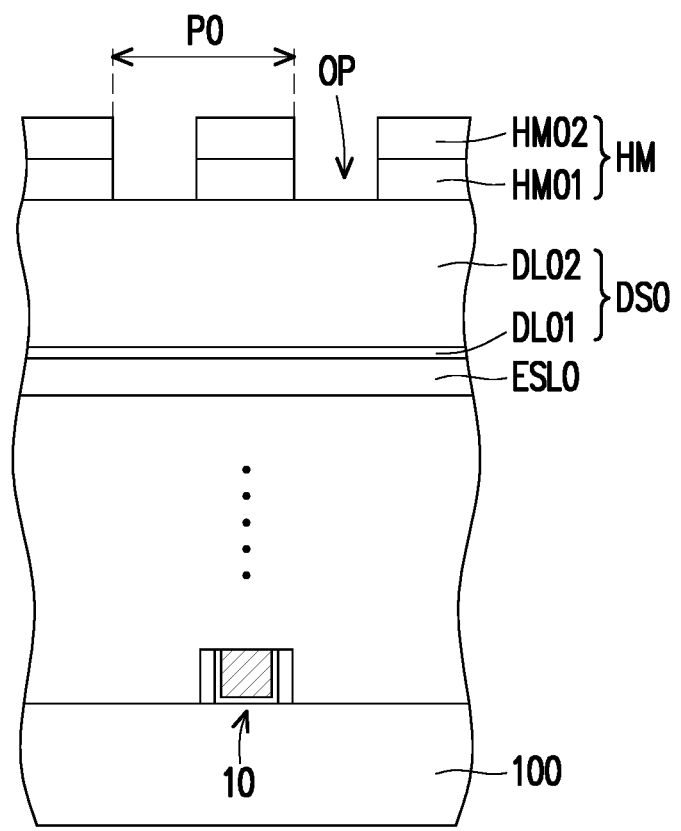
FIG. 2A to FIG. 2G are schematic cross-sectional views of a method of forming a conductive structure in accordance with some embodiments.

Referring to FIG. 2A, a substrate 100 is provided. In some embodiments, the substrate 100 has a device 10 formed thereon. The device 10 may be a portion of an integrated circuit chip or a system on chip (SoC) that includes various passive and active microelectronic devices. In some embodiments, as shown in FIG. 1, the substrate 100 has a gate 106 disposed thereon, a strained layer 112 disposed therein and aside the gate 106, and a contact 124 disposed over and electrically connected to the strained layer 112, and a dielectric layer 120 disposed over the gate 106 and around the contact 124. However, the application is not limited thereto. In other embodiments, upon the process requirements, the substrate 100 may have a planar device without fins or a gate-all-around (GAA) device.

Thereafter, an etching stop layer ESL0 is formed over the device 10. In some embodiments, the etching stop layer ESL0 is formed on a dielectric layer 120 (as shown in FIG. 1) over the device 10. The etching stop layer ESL0 may include a metal oxide containing a metal selected from the group consisting of metals of Group 4 of the periodic table, metals of Group 5 of the periodic table, metals of Group 6 of the periodic table, and yttrium. For example, the etching stop layer ESL0 includes SiCN, AlN, $Al_2O_3$, TaO, LaO or a combination thereof, and the forming method thereof includes performing a chemical vapor deposition (CVD) process such as a plasma enhanced CVD (PECVD) or an atomic layer deposition (ALD) process.

Afterwards, a dielectric structure DS0 is formed on the etching stop layer ESL0. In some embodiments, the method of forming the dielectric structure DS0 is described with reference to FIG. 3. In some embodiments, the method of forming the dielectric structure DS0 includes performing a chemical vapor deposition (CVD) process such as a plasma enhanced CVD (PECVD) or an atomic layer deposition (ALD) process.

Referring to FIG. 3, at act 302, the substrate 100 is provided in a process chamber. In some embodiments, the process chamber is a CVD chamber. In alternative embodiments, the process chamber is an ALD chamber.

Referring to FIG. 3, at act 304, a silicon-containing heterocyclic compound precursor and an oxygen-containing compound precursor are introduced into the process chamber in a predetermined flow rate ratio, so as to form a SiOC film on the substrate 100.

The silicon-containing heterocyclic compound precursor is a silicon-containing 5-membered ring or 6-membered ring. In some embodiments, the silicon-containing heterocyclic compound precursor is represented by one of the formulae (I) and (II):

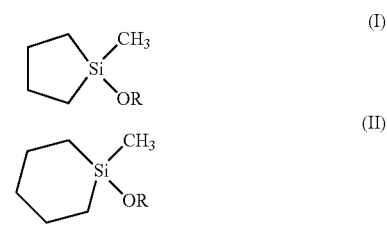

wherein R is $C_xH_{2x+1}$, and x is an integer from 1 to 6.

In some embodiments, in the silicon-containing heterocyclic compound precursor represented by one of the formulae (I) and (II), Si—$CH_3$ bonding content (at 1270 $cm^{-1}$) is less than about 24% (e.g., 10-24%) and Si—C—Si bonding content (or called bridge carbon content, including Si—$CH_2$—Si bond at 1360 $cm^{-1}$ and Si—$(CH_2)_2$—Si bond at 1420 $cm^{-1}$) is about 20-50%, with respect to all Si—X bonding (e.g., Si—O, Si—C, Si—C—Si . . . ) content. The bonding content may be calculated by the FTIR spectrum of the silicon-containing heterocyclic compound precursor represented by one of the formulae (I) and (II).

In some embodiments, the oxygen-containing compound precursor includes $O_2$, $O_3$, NO, $N_2O$, $CO_2$ or combination thereof.

In some embodiments, the silicon-containing heterocyclic compound precursor and the oxygen-containing compound precursor are introduced into the process chamber in a flow rate ratio of greater than 13. For example, the silicon-containing heterocyclic compound precursor and the oxygen-containing compound precursor are introduced into the process chamber in a flow rate ratio of about 13:1 to 15:1, such as 14:1. The flow rate ratio of the silicon-containing heterocyclic compound precursor to the oxygen-containing compound precursor may be more than any one of the preceding values upon the process requirements. In some embodiments, the flow rate of the oxygen-containing compound precursor is about 30 sccm to 90 sccm, and the flow rate of the silicon-containing heterocyclic compound precursor is more than about 300 sccm or more than 390 sccm. For example, the flow rate of the silicon-containing heterocyclic compound precursor ranges from about 300 sccm to 650 sccm.

In some embodiments, in a PECVD process, the temperature ranges from 250° C. to 300° C., the pressure ranges from 5 torr to 10 torr, and the RF power ranges from 200 W to 500 W. In some embodiments, a dilute gas is introduced into the process chamber during the step of introducing the silicon-containing heterocyclic compound precursor and the oxygen-containing compound precursor. In some embodiments, the dilute gas includes He, Ar, $N_2$ or a combination thereof.

In some embodiments, an in-situ plasma treatment is selected after film deposition for residue gas termination, in which the temperature ranges from 250° C. to 300° C. and the RF power ranges from 200 W to 500 W.

Referring to FIG. 3, at act 306, a curing operation is performed to the SiOC film. In some embodiments, the curing operation is a UV curing operation, in which the UV wavelength ranges from 190 nm to 320 nm, the temperature ranges from 300° C. to 450° C., the pressure ranges from 1 torr to 50 torr, and the curing time ranges from 3 seconds to 60 seconds. In some embodiments, the environment for the curing operation is filled with the inert gas including He, Ar, $N_2$ or a combination thereof. The curing temperature is beneficial to remove moisture and reconstruct dangling bonds of the dielectric film.

In the disclosure, the silicon-containing heterocyclic compound precursor replaces the conventional linear compound precursor, so as to improve the hardness while maintain the dielectric constant of the SiOC film.

The reaction rates of the precursors may be changed according to the underlying material, and different reaction rates of the precursors may produce films with different element contents. In some embodiments, the precursors of the disclosure are first in contact with the etching stop layer (e.g., $Al_2O_3$) to form a thin dielectric layer (e.g., SiOC), and then in contact with the thin dielectric layer to form a thick dielectric layer (e.g., SiOC). Accordingly, the SiOC film is formed with two layers including a dielectric layer DL01 and a dielectric layer DL02 with different element contents. Specifically, the dielectric layer DL01 is between the dielectric layer DL02 and the etching stop layer ESL0.

In some embodiments, the average carbon atom content of the dielectric layer DL02 is higher than the average carbon atom content of the dielectric layer DL01. The dielectric layer DL02 is referred to as a carbon-rich dielectric layer in some examples.

In some embodiments, the average oxygen atom content of the dielectric layer DL02 is lower than the average oxygen atom content of the dielectric layer DL01. The dielectric layer DL01 is referred to as an oxygen-rich dielectric layer in some examples.

For example, an upper portion of the SiC film has a carbon concentration greater than that of a lower portion of the SiC film, and the upper portion of the SiC film has an oxygen concentration less than that of the lower portion of the SiC film.

In some embodiments, the dielectric layer DL01 includes a carbon atom content of about 10-15 at % and an oxygen atom content of about 35-40 at %. In some embodiments, the dielectric layer DL02 includes a carbon atom content of about 13-20 at % and an oxygen atom content of about 30-33 at %. The atom contents may be calculated by the EELS method.

In some embodiments, the dielectric constant of the dielectric structure DS0 is less than 3.2. In some embodiments, the dielectric constant of the dielectric structure DS0 is 3.10 to 3.19, such as 3.11, 3.12, 3.13, 3.14, 3.15, 3.16, 3.17 or 3.18, including any range between any two of the preceding values. The dielectric constant of the dielectric structure DS0 is such as to reduce the RC delay while improve the hardness of the dielectric structure DS0. In some embodiments, the dielectric constant of the lower dielectric layer DL01 is less than the dielectric constant of the upper dielectric layer DL02.

In some embodiments, the thickness ratio of the dielectric layer DL01 of the dielectric layer DL02 ranges from 1:10 to 1:20, such as 1:11, 1:12, 1:13, 1:14, 1:15, 1:16, 1:17, 1:18, 1:19, including any range between any two of the preceding values.

The above embodiments in which the dielectric layer DL01 and the dielectric layer DL02 include SiOC are provided for illustration purposes, and are not construed as limiting the present disclosure. In alternative embodiments, the dielectric layer DL01 and the dielectric layer DL02 may include SiOCH, SiOCN or a suitable material by adjusting precursor species for and the flow rate ratio between the precursor species.

Still referring to FIG. 2A, a hard mask structure HM is formed over the dielectric structure DS0, wherein the hard mask structure HM has a plurality of opening patterns OP therein. In some embodiments, the pitch P0 of the opening patterns OP is about 40 nm, 24 nm, 22 nm or less. In some embodiments, the hard mask structure HM includes silicon oxide, silicon nitride, silicon carbide, amorphous carbon, a photoresist material, TiN, a suitable hard mask material, or a combination thereof. In some embodiments, the hard mask structure HM may be a single-layer structure. In some embodiments, the hard mask structure HM may be a multi-layer structure. For example, the hard mask structure HM includes a lower mask layer HM01 and an upper mask layer HM02, the lower mask layer HM01 includes silicon oxide, and the upper mask layer HM02 includes TiN.

Figure 2B:
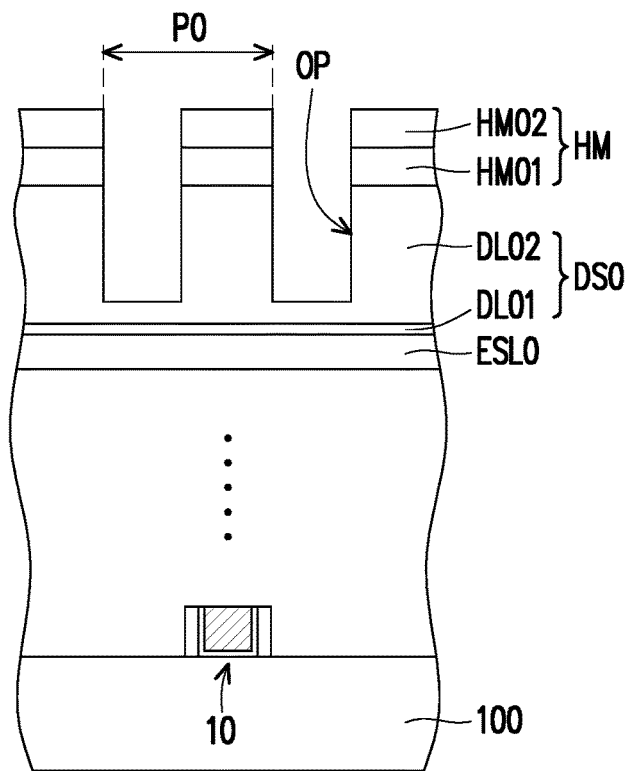

Referring to FIG. 2B, a dry etching process is performed to the dielectric structure DS0 by using the hard mask structure HM as a mask, so as to deepen the opening patterns OP into the dielectric layer DL02. Specifically, the opening patterns OP of the hard mask structure HM are transferred to a portion of the dielectric layer DL02. In some embodiments, the etching gas of the dry etching process includes $C_xF_y$ (wherein x and y are greater than zero), $NF_3$, the like, or a combination thereof.

Figure 2C:
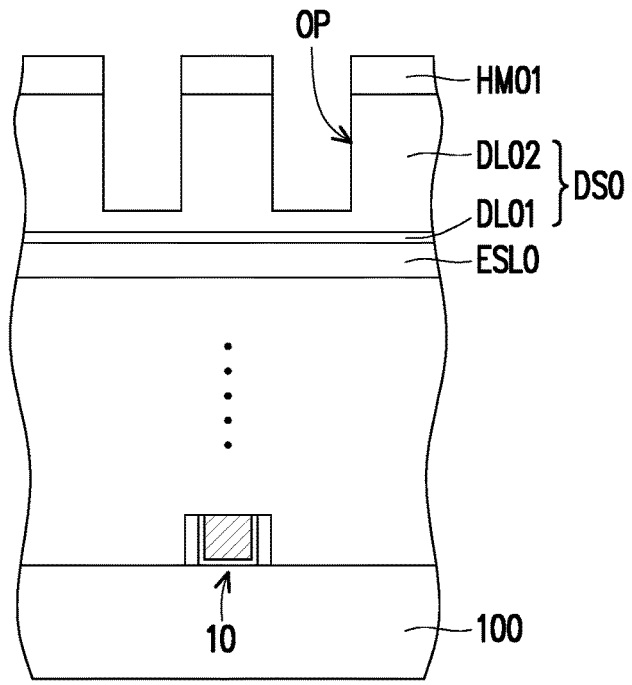

Referring to FIG. 2C, a wet cleaning process is performed to the dielectric structure DS0. The wet cleaning process removes the polymer residues of the dry etching process. In some embodiments, the wet cleaning process simultaneously removes the upper mask layer HM02 of the hard mask structure HM. In some embodiments, the etching solution of the wet clean process includes dHF, HCl, $H_2O_2$, the like, or a combination thereof.

Figure 2D:
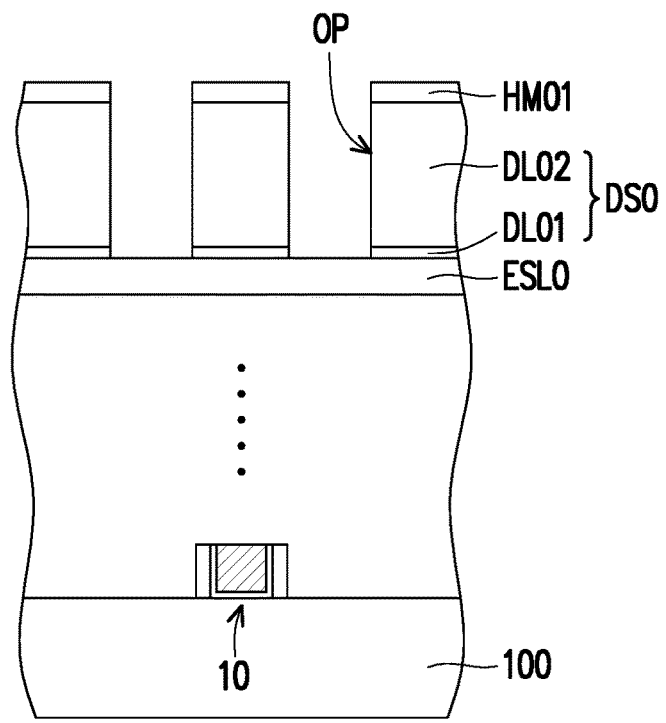

Referring to FIG. 2D, another dry etching process is performed to the dielectric structure DS0 by using the lower mask structure HM01 as a mask, so as to deepen the opening patterns OP into the dielectric layer DL01. Specifically, the opening patterns OP penetrate through dielectric layers DL01 and DL02 and expose the surface of the etching stop layer ESL0. In some embodiments, the etching gas of the dry etching process includes $C_xF_y$ (wherein x and y are greater than zero), $NF_3$, the like, or a combination thereof.

Figure 2E:
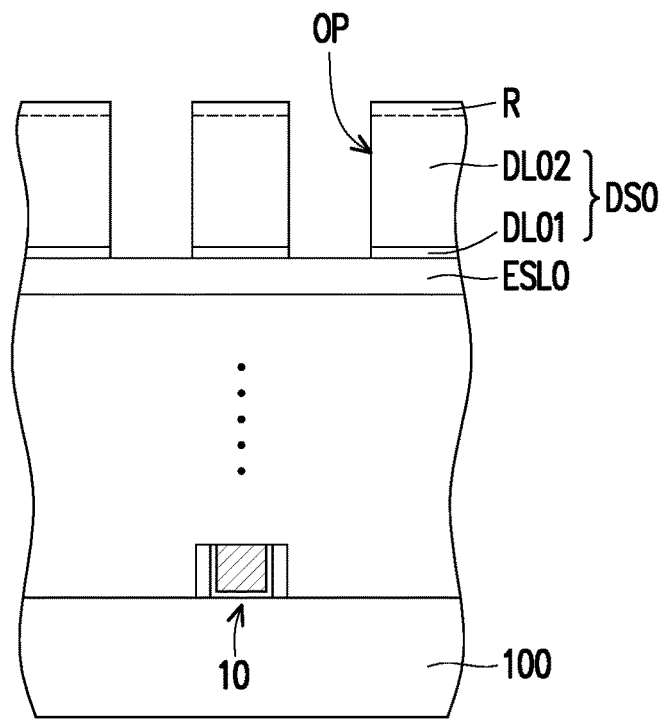

Referring to FIG. 2E, another wet cleaning process is performed to the dielectric structure DS0, so as to deepen the opening patterns OP into the etching stop layer ESL0. Specifically, the opening patterns OP penetrate through dielectric structure DS0 and the etching stop layer ESL0. In some embodiments, the etching solution of the wet clean process includes dHF, HCl, $H_2O_2$, the like, or a combination thereof. The lower mask structure HM01 is then removed.

Upon the etching and cleaning processes, the dielectric structure DS0 has a carbon loss region R of about 2 nm or less. In some embodiments, the carbon loss region R is the surface region of the dielectric layer DL0. The conventional dielectric structure has a carbon loss region of about 6 nm. The carbon loss region of the disclosure is significantly reduced because the dielectric structure of the embodiment is formed from a silicon-containing heterocyclic compound precursor rather than the conventional linear compound precursor. Specifically, in the disclosure, the upper layer (e.g., dielectric layer DL0) of the dielectric structure DS0 exhibits a higher carbon atom content and therefore provides a better capability against the subsequent etching and cleaning processes, so the carbon loss region R is significantly reduced after defining the opening patterns OP. In some embodiments, the carbon atom content of the carbon loss region R is less than the carbon atom content of the underlying dielectric layers DL02. For example, the carbon atom content of the carbon loss region R is 12-18 at %. In some embodiments, the carbon atom content of the carbon loss region R is between the carbon atom content of the dielectric layer DL02 and the carbon atom content of the dielectric layer DL01. In some embodiments, the oxygen atom content of the carbon loss region is similar to the oxygen atom content of the dielectric layer DL01, such as 30-33 at %.

Figure 2F:
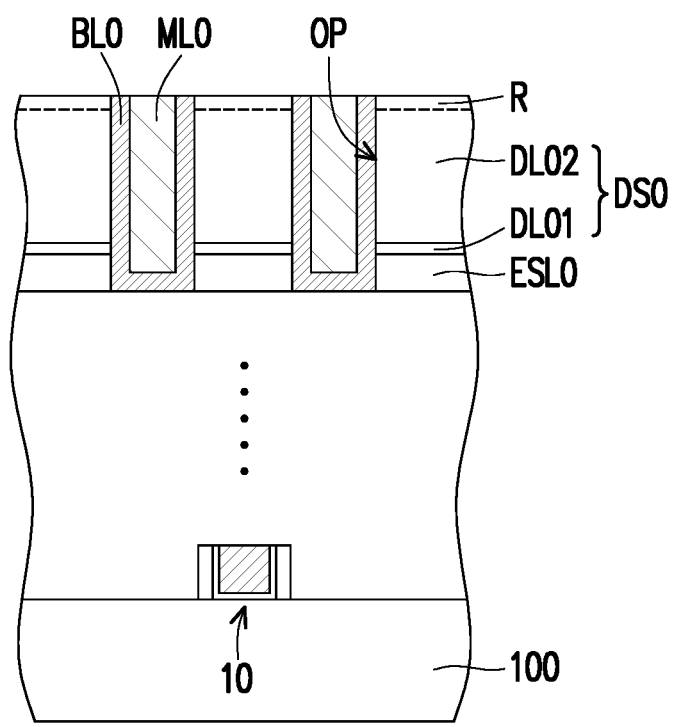

Referring to FIG. 2F, a metal layer ML0 is formed in the opening patterns OP of the dielectric structure DS0. In some embodiments, the metal layer ML0 is an ultra-high density (UHD) layer including a plurality of metal lines substantially parallel to each other. In some embodiments, the metal layer ML0 is a low resistance metal material including tungsten (W), cobalt (Co), copper (Cu), aluminum (Al), the like, or a combination thereof. A barrier layer BL0 may be disposed between the metal layer ML0 and the dielectric structure DS0. The barrier layer BL0 may include Ti, Ta, TiN, TaN, the like, or a combination thereof. In some embodiments, the method of forming the metal layer ML0 includes performing a plating process, a sputtering process or a deposition process, and followed by a chemical mechanical polishing (CMP) process.

In some embodiments, the disclosure provides a conductive structure including a low-k dielectric structure DS0 and a metal layer ML0. The low-k dielectric structure DS0 includes a first dielectric layer DL01 and a second dielectric layer DL02 over the first dielectric layer DL01. In some embodiments, dielectric constant of the low-k dielectric structure DS0 is less than 3.2, and an average carbon atom content of the second dielectric layer is higher than an average carbon atom content of the first dielectric layer. The metal lines of the metal layer ML0 penetrate through the low-k dielectric structure DS0.

Figure 2G:
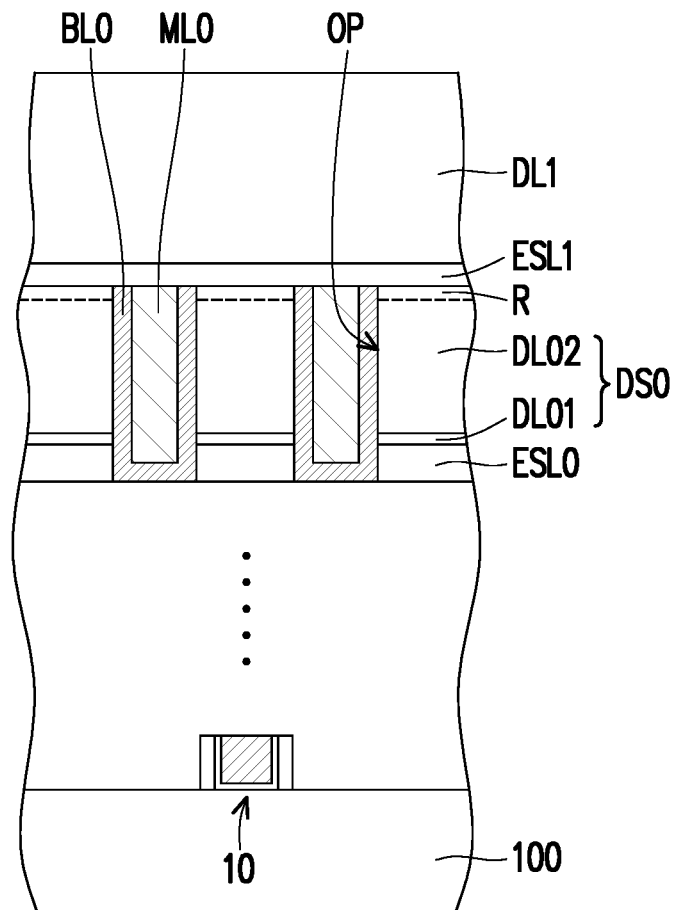

Referring to FIG. 2G, a dielectric layer DL1 is formed on the dielectric structure DS0. In some embodiments, the method of forming the dielectric layer DL1 is similar to the dielectric structure DS0, except that the silicon precursors and the chamber temperatures are different between two layers.

In some embodiments, the method of forming the dielectric layer DL1 includes performing a chemical vapor deposition (CVD) process such as a plasma enhanced CVD (PECVD) or an atomic layer deposition (ALD) process.

The substrate 100 is provided in a process chamber. In some embodiments, the process chamber is a CVD chamber. In alternative embodiments, the process chamber is an ALD chamber.

Thereafter, a silicon-containing linear compound precursor and an oxygen-containing compound precursor are introduced into the process chamber in a predetermined flow rate ratio, so as to form a dielectric layer DL1 (e.g., SiOC film) on the dielectric structure DS0. In some embodiments, the silicon-containing linear compound precursor includes diethoxymethylsilane (DEMS), dimethoxydimethylsilane (DMDMOS) or a derivative thereof. In some embodiments, the oxygen-containing compound precursor includes $O_2$, $O_3$, NO, $N_2O$, $CO_2$ or combination thereof.

In some embodiments, the silicon-containing linear compound precursor and the oxygen-containing compound precursor are introduced into the process chamber in a flow rate ratio of greater than 13. For example, the silicon-containing linear compound precursor and the oxygen-containing compound precursor are introduced into the process chamber in a flow rate ratio of about 13:1 to 15:1, such as 14:1. The flow rate ratio of the silicon-containing linear compound precursor to the oxygen-containing compound precursor may be more than any one of the preceding values upon the process requirements. In some embodiments, the flow rate of the oxygen-containing compound precursor is about 30 sccm to 90 sccm, and the flow rate of the silicon-containing linear compound precursor is more than about 300 sccm or more than 390 sccm. For example, the flow rate of the s silicon-containing linear compound precursor ranges from about 300 sccm to 650 sccm.

In some embodiments, in a PECVD process, the temperature ranges from 350° C. to 400° C., the pressure ranges from 5 torr to 10 torr, and the RF power ranges from 200 W to 500 W. In some embodiments, a dilute gas is introduced into the process chamber during the step of introducing the silicon-containing linear compound precursor and the oxygen-containing compound precursor. In some embodiments, the dilute gas includes He, Ar, $N_2$ or a combination thereof.

In some embodiments, an in-situ plasma treatment is selected after film deposition for residue gas termination, in which the temperature ranges from 350° C. to 400° C. and the RF power ranges from 200 W to 500 W.

Thereafter, a curing operation is performed to the dielectric layer DL1 (e.g., SiOC film). In some embodiments, the curing operation is a UV curing operation, in which the UV wavelength ranges from 190 nm to 320 nm, the temperature ranges from 300° C. to 450° C., the pressure ranges from 1 torr to 50 torr, and the curing time ranges from 3 seconds to 60 seconds. In some embodiments, the environment for the curing operation is filled with the inert gas including He, Ar, $N_2$ or a combination thereof. The curing temperature is beneficial to remove moisture and reconstruct dangling bonds of the dielectric film.

Figure 4:
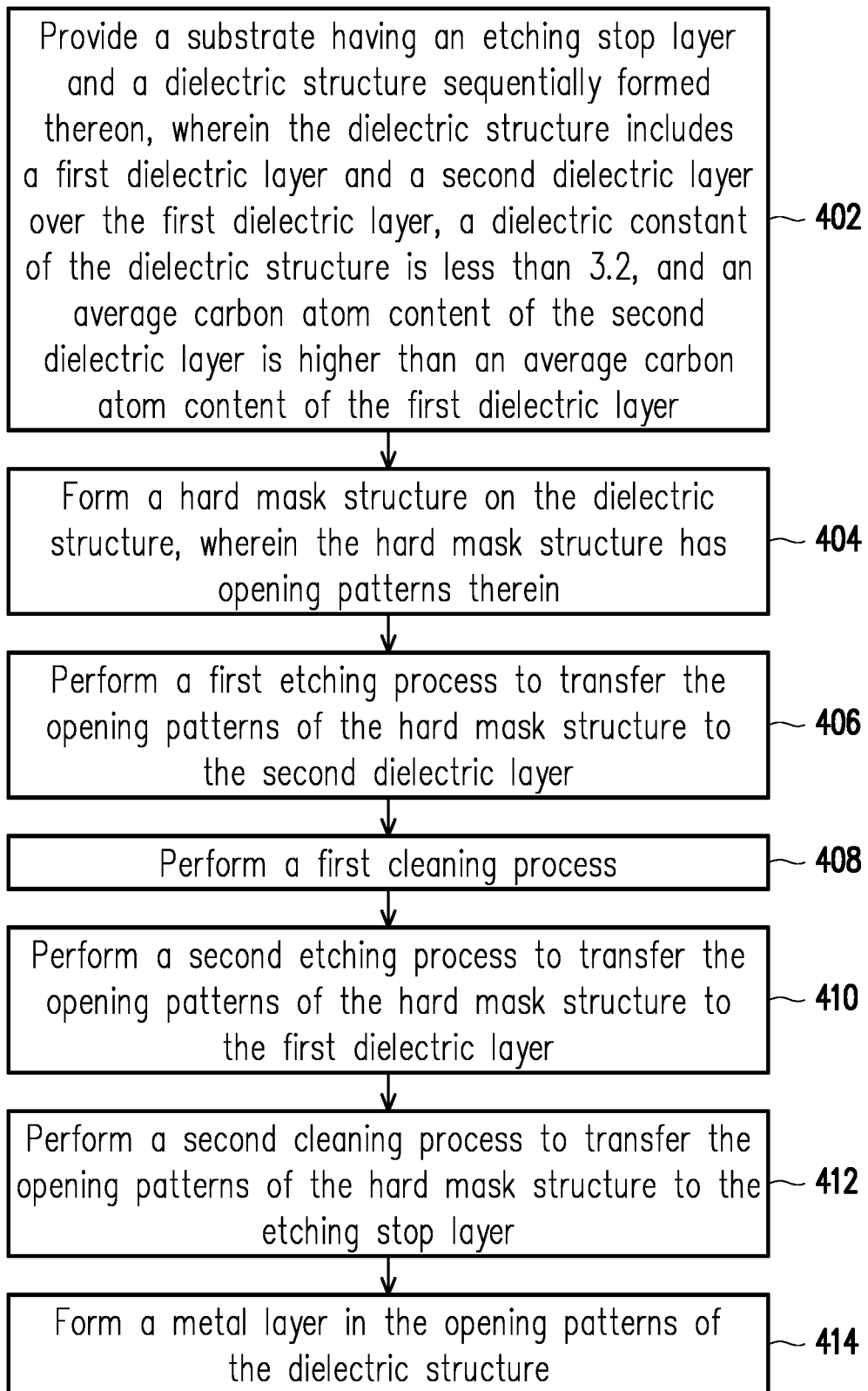
FIG. 4 is a flow chart of a method of forming a conductive structure in accordance with some embodiments.

FIG. 4 is a flow chart of a method of forming a conductive structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 402, a substrate is provided with an etching stop layer and a dielectric structure sequentially formed thereon, wherein the dielectric structure includes a first dielectric layer and a second dielectric layer over the first dielectric layer, a dielectric constant of the dielectric structure is less than 3.2, and an average carbon atom content of the second dielectric layer is higher than an average carbon atom content of the first dielectric layer. FIG. 2A illustrates a cross-sectional view corresponding to some embodiments of act 402.

At act 404, a hard mask structure is formed on the dielectric structure, wherein the hard mask structure has opening patterns therein. FIG. 2A illustrates a cross-sectional view corresponding to some embodiments of act 404.

At act 406, a first etching process is performed to transfer the opening patterns of the hard mask structure to the second dielectric layer. FIG. 2B illustrates a cross-sectional view corresponding to some embodiments of act 406.

At act 408, a first cleaning process is performed. FIG. 2C illustrates a cross-sectional view corresponding to some embodiments of act 408.

At act 410, a second etching process is performed to transfer the opening patterns of the hard mask structure to the first dielectric layer. FIG. 2D illustrates a cross-sectional view corresponding to some embodiments of act 410.

At act 412, a second cleaning process is performed to transfer the opening patterns of the hard mask structure to the etching stop layer. FIG. 2E illustrates a cross-sectional view corresponding to some embodiments of act 412.

At act 414, a metal layer is formed in the opening patterns of the dielectric structure. FIG. 2E illustrates a cross-sectional view corresponding to some embodiments of act 414.

Figure 5:
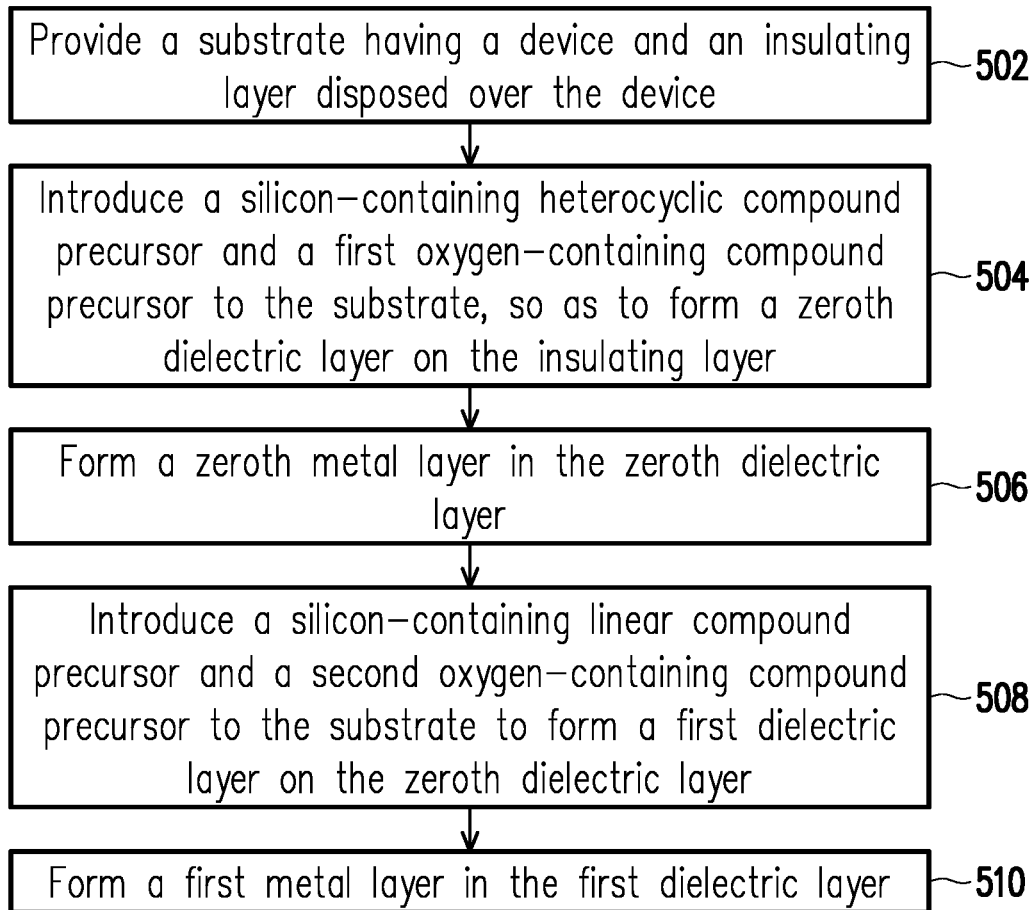
FIG. 5 is a flow chart of a method of forming a semiconductor device in accordance with some embodiments.

FIG. 5 is a flow chart of a method of forming a semiconductor device in accordance with some embodiments.

At act 502, a substrate is provided with a device and an insulating layer disposed over the device. The device may be a logic device, a memory device or any suitable device. At act 504, a silicon-containing heterocyclic compound precursor and a first oxygen-containing compound precursor are introduced to the substrate, so as to form a zeroth dielectric layer on the insulating layer. At act 506, a zeroth metal layer is formed in the zeroth dielectric layer. At act 508, a silicon-containing linear compound precursor and a second oxygen-containing compound precursor are introduced to the substrate to form a first dielectric layer on the zeroth dielectric layer. At act 510, a first metal layer is formed in the first dielectric layer.

Figure 6:
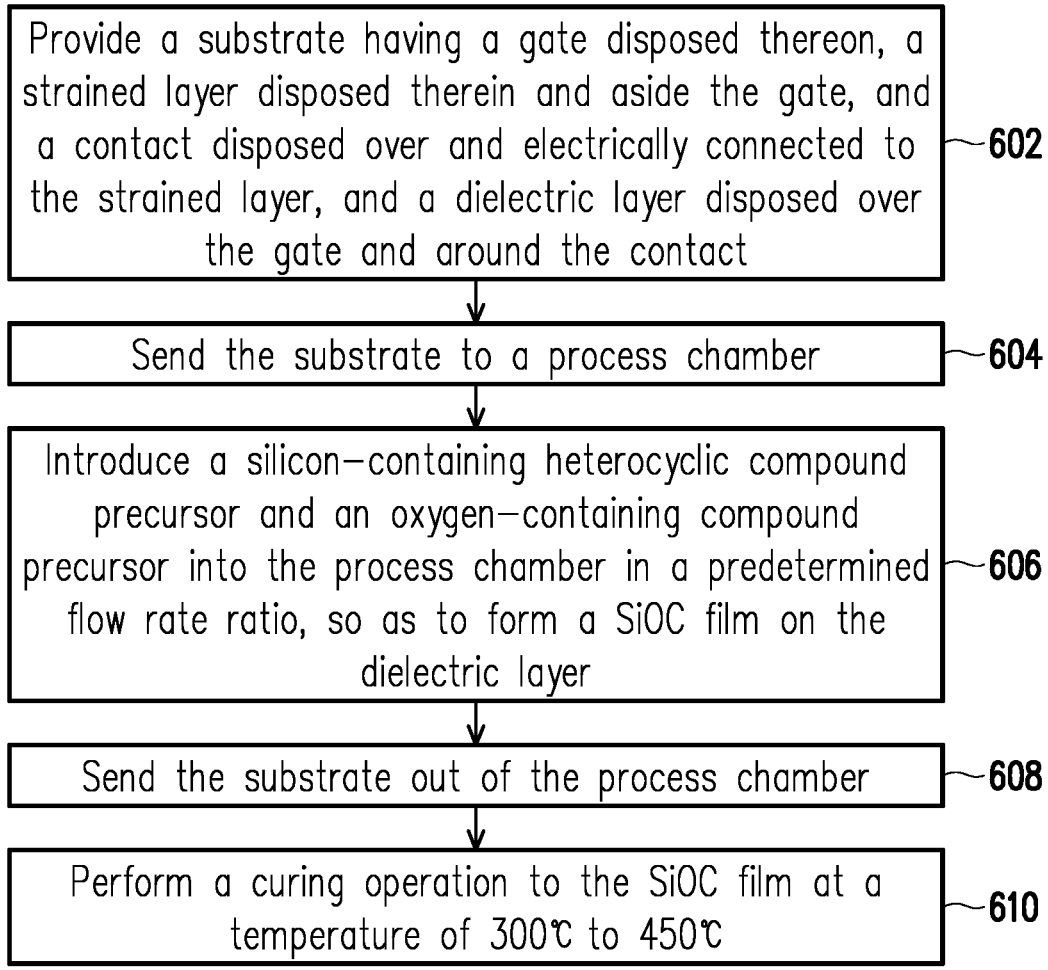
FIG. 6 is a flow chart of a method of forming a semiconductor device in accordance with some embodiments.

FIG. 6 is a flow chart of a method of forming a semiconductor device in accordance with some embodiments.

At act 602, a substrate is provided, wherein the substrate has a gate disposed thereon, a strained layer disposed therein and aside the gate, and a contact disposed over and electrically connected to the strained layer, and a dielectric layer disposed over the gate and around the contact. At act 604, the substrate is sent to a process chamber. At act 606, a silicon-containing heterocyclic compound precursor and an oxygen-containing compound precursor are introduced into the process chamber in a predetermined flow rate ratio, so as to form a SiOC film on the dielectric layer. At act 608, the substrate is sent out of the process chamber. At act 610, a curing operation is performed to the SiOC film at a temperature of 300° C. to 450° C.

In the above-mentioned embodiments, a "gate last" process is implemented to form a FinFET device. However, another process such as a "gate first" process or another type of device (e.g., planar device) may be applied by using similar processes as described herein. The methods disclosed herein may be easily integrated with a CMOS process flow and do not require additional complicated operations to achieve the desired results. It is understood that embodiments disclosed herein offer different advantages, and that no particular advantage is necessarily required for all embodiments.

The above embodiments in which the conductive structure is a part of an interconnect structure are provided for illustration purposes, and are not construed as limiting the present disclosure. In alternative embodiments, the conductive structure is a part of a redistribution layer structure of semiconductor package.

In view of the above, in some embodiments, a precursor of high C/Si ratio is utilized to produce an ultra-low-k film with a high carbon content (k value less than 3.20, carbon concentration over 13%), so as to achieve excellent line opening depth loading and less carbon loss while metal line spacing shrinks down to 28 nm.

In accordance with some embodiments of the present disclosure, a conductive structure including a low-k dielectric structure and metal lines. The low-k dielectric structure is disposed on a substrate and includes a first dielectric layer and a second dielectric layer over the first dielectric layer. In some embodiments, dielectric constant of the low-k dielectric structure DS0 is less than 3.2, and an average carbon atom content of the second dielectric layer is higher than an average carbon atom content of the first dielectric layer. The metal lines penetrate through the low-k dielectric structure.

In accordance with alternative embodiments of the present disclosure, a method of forming a low-k dielectric structure that includes the following operations. A substrate is provided in a process chamber. A silicon-containing heterocyclic compound precursor and an oxygen-containing compound precursor are introduced into the process chamber in a predetermined flow rate ratio, so as to form a SiOC film on the substrate.

In accordance with yet alternative embodiments of the present disclosure, a semiconductor device includes a gate, a strained layer, a contact, a metal line and a carbon-rich dielectric layer. The gate is disposed over a substrate. The strained layer is disposed in the substrate aside the gate. The contact is disposed over and electrically connected to the strained layer. The metal line is disposed over and electrically connected to the contact. The carbon-rich dielectric layer is disposed over the contact and around the metal line, wherein the carbon-rich dielectric layer having a dielectric constant of 3.10 to 3.19.

In accordance with some embodiments of the present disclosure, a method of forming a semiconductor device includes the following operations. A substrate is provided with a device and an insulating layer disposed over the device. A silicon-containing heterocyclic compound precursor and a first oxygen-containing compound precursor are introduced to the substrate, so as to form a zeroth dielectric layer on the insulating layer. A zeroth metal layer is formed in the zeroth dielectric layer. A silicon-containing linear compound precursor and a second oxygen-containing compound precursor are introduced to the substrate to form a first dielectric layer on the zeroth dielectric layer. A first metal layer is formed in the first dielectric layer.

In accordance with some embodiments of the present disclosure, a method of forming a semiconductor device includes the following operations. A substrate is provided, wherein the substrate has a gate disposed thereon, a strained layer disposed therein and aside the gate, and a contact disposed over and electrically connected to the strained layer, and a dielectric layer disposed over the gate and around the contact. The substrate is sent to a process chamber. A silicon-containing heterocyclic compound precursor and an oxygen-containing compound precursor are introduced into the process chamber in a predetermined flow rate ratio, so as to form a SiOC film on the dielectric layer. The substrate is sent out of the process chamber. A curing operation is performed to the SiOC film at a temperature of 300° C. to 450° C.

In accordance with some embodiments of the present disclosure, a semiconductor device includes a gate disposed over a substrate, a strained layer disposed in the substrate aside the gate, a contact disposed over and electrically connected to the strained layer, a metal line disposed over and electrically connected to the contact, and a low-k dielectric structure disposed over the contact and around the metal line. The low-k dielectric structure includes an oxygen-rich dielectric layer, and a carbon-rich dielectric layer disposed over the oxygen-rich dielectric layer, wherein an average carbon atom content of the carbon-rich dielectric layer is higher than an average carbon atom content of the oxygen-rich dielectric layer, and an average oxygen atom content of the carbon-rich dielectric layer is lower than an average oxygen atom content of the oxygen-rich dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a device disposed over a substrate;
an insulating layer disposed over the device;
a contact penetrating through the insulating layer and electrically connected to the device;
a zeroth dielectric layer disposed on the insulating layer, wherein the zeroth dielectric layer comprises a silicon-containing heterocyclic compound, wherein the silicon-containing heterocyclic compound is represented by one of the formulae (I) and (II):

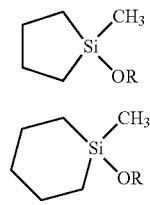

wherein R is $C_xH_{2x+1}$, and x is an integer from 1 to 6, wherein a dielectric constant of the zeroth dielectric layer is less than 3.2 and greater than 3.0; and
a zeroth metal layer penetrating through the zeroth dielectric layer and electrically to the device.

2. The semiconductor structure of claim 1, further comprising:
a first dielectric layer disposed on the zeroth dielectric layer and comprising a silicon-containing linear compound; and
a first metal layer penetrating through the first dielectric layer and electrically connected to the zeroth metal layer.

3. The semiconductor structure of claim 2, wherein the silicon-containing linear compound comprises diethoxymethylsilane (DEMS), dimethoxydimethylsilane (DMDMOS) or a derivative thereof.

4. The semiconductor structure of claim 2, wherein a dielectric constant of the zeroth dielectric layer is higher than a dielectric constant of the first dielectric layer.

5. The semiconductor structure of claim 4, wherein the dielectric constant of the zeroth dielectric layer is from 3.10 to 3.19.

6. The semiconductor structure of claim 1, wherein an upper portion of the zeroth dielectric layer has a carbon concentration higher than that of a lower portion of the zeroth dielectric layer.

7. The semiconductor structure of claim 1, wherein an upper portion of the zeroth dielectric layer has an oxygen concentration lower than that of a lower portion of the zeroth dielectric layer.

8. The semiconductor structure of claim 1, further comprising an etching stop layer between the zeroth dielectric layer and the insulating layer, wherein the etching stop layer comprises SiCN, AlN, $Al_2O_3$, TaO, LaO or a combination thereof.

9. A semiconductor device, comprising:
a device disposed over a substrate;
an insulating layer disposed over the device;
a contact penetrating through the insulating layer and electrically connected to the device;
a zeroth dielectric layer disposed on the insulating layer, wherein the zeroth dielectric layer comprises a silicon-containing heterocyclic compound, wherein the silicon-containing heterocyclic compound is represented by one of the formulae (I) and (II):

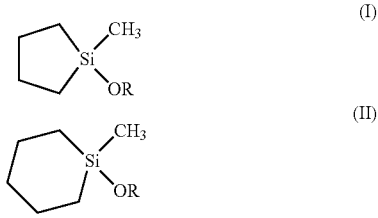

wherein R is $C_xH_{2x+1}$, and x is an integer from 1 to 6, wherein a dielectric constant of the zeroth dielectric layer is less than 3.2 and greater than 3.0;
a zeroth metal layer penetrating through the zeroth dielectric layer and electrically to the device; and
a first dielectric layer disposed on the zeroth dielectric layer and comprising a silicon-containing linear compound.

10. The semiconductor structure of claim 9, further comprising an etching stop layer between the zeroth dielectric layer and the insulating layer.

11. The semiconductor structure of claim 9, wherein the silicon-containing linear compound comprises diethoxymethylsilane (DEMS), dimethoxydimethylsilane (DMDMOS) or a derivative thereof.

12. The semiconductor structure of claim 9, wherein a dielectric constant of the zeroth dielectric layer is higher than a dielectric constant of the first dielectric layer.

13. The semiconductor structure of claim 9, wherein an upper portion of the zeroth dielectric layer has a carbon concentration higher than that of a lower portion of the zeroth dielectric layer.

14. The semiconductor structure of claim 9, wherein an upper portion of the zeroth dielectric layer has an oxygen concentration lower than that of a lower portion of the zeroth dielectric layer.

15. A semiconductor device, comprising:
a device disposed over a substrate;
an insulating layer disposed over the device;
a contact penetrating through the insulating layer and electrically connected to the device;
a zeroth dielectric layer disposed on the insulating layer and the etching stop layer, wherein the zeroth dielectric layer comprises a silicon-containing heterocyclic compound, wherein the silicon-containing heterocyclic compound is represented by one of the formulae (I) and (II):

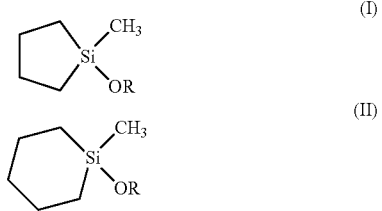

wherein R is $C_xH_{2x+1}$, and x is an integer from 1 to 6, wherein a dielectric constant of the zeroth dielectric layer is less than 3.2 and greater than 3.0;

a zeroth metal layer penetrating through the zeroth dielectric layer and electrically to the device; and
an etching stop layer between the zeroth dielectric layer and the insulating layer.

16. The semiconductor structure of claim 15, further comprising:
a first dielectric layer disposed on the zeroth dielectric layer and comprising a silicon-containing linear compound; and
a first metal layer penetrating through the first dielectric layer and electrically connected to the zeroth metal layer.

17. The semiconductor structure of claim 16, wherein the silicon-containing linear compound comprises diethoxymethylsilane (DEMS), dimethoxydimethylsilane (DMDMOS) or a derivative thereof.

18. The semiconductor structure of claim 16, wherein a dielectric constant of the zeroth dielectric layer is higher than a dielectric constant of the first dielectric layer.

19. The semiconductor structure of claim 15, wherein an upper portion of the zeroth dielectric layer has a carbon concentration higher than that of a lower portion of the zeroth dielectric layer.

20. The semiconductor structure of claim 15, wherein an upper portion of the zeroth dielectric layer has a carbon concentration lower than that of a lower portion of the zeroth dielectric layer.

* * * * *